United States Patent
Cabral, Jr. et al.

(10) Patent No.: US 7,271,486 B2
(45) Date of Patent: Sep. 18, 2007

(54) RETARDING AGGLOMERATION OF NI MONOSILICIDE USING NI ALLOYS

(75) Inventors: Cyril Cabral, Jr., Ossining, NY (US); Roy A. Carruthers, Stormville, NY (US); Christophe Detavernier, Ossining, NY (US); James M. E. Harper, Durham, NH (US); Christian Lavoie, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/075,289

(22) Filed: Mar. 8, 2005

(65) Prior Publication Data

US 2005/0176247 A1    Aug. 11, 2005

Related U.S. Application Data

(62) Division of application No. 10/334,464, filed on Dec. 31, 2002, now Pat. No. 6,905,560.

(51) Int. Cl.
*H01L 23/48* (2006.01)
*H01L 23/52* (2006.01)
*H01L 29/40* (2006.01)

(52) U.S. Cl. ............... 257/754; 257/E23.072; 257/E23.146; 257/757

(58) Field of Classification Search ............... 438/682; 257/754, 755, 757, E23.072, E23.146, E23.145
See application file for complete search history.

(56) References Cited

U.S. PATENT DOCUMENTS

| | | | | |
|---|---|---|---|---|
| 5,302,552 A | * | 4/1994 | Duchateau et al. | 438/664 |
| 6,468,901 B1 | * | 10/2002 | Maa et al. | 438/655 |
| 6,531,396 B1 | * | 3/2003 | Chi et al. | 438/682 |
| 7,078,345 B2 | | 7/2006 | Iinuma | |
| 7,119,012 B2 | * | 10/2006 | Carruthers et al. | 438/660 |
| 7,157,777 B2 | | 1/2007 | Tsuckiaki et al. | |
| 2005/0236715 A1 | * | 10/2005 | Ku et al. | 257/768 |

* cited by examiner

*Primary Examiner*—Caridad Everhart
(74) *Attorney, Agent, or Firm*—Scully, Scott, Murphy & Presser, P.C.; Robert M. Trepp, Esq.

(57) ABSTRACT

A method for providing a low resistance non-agglomerated Ni monosilicide contact that is useful in semiconductor devices. Where the inventive method of fabricating a substantially non-agglomerated Ni alloy monosilicide comprises the steps of: forming a metal alloy layer over a portion of a Si-containing substrate, wherein said metal alloy layer comprises of Ni and one or multiple alloying additive(s), where said alloying additive is Ti, V, Ge, Cr, Zr, Nb, Mo, Hf, Ta, W, Re, Rh, Pd or Pt or mixtures thereof; annealing the metal alloy layer at a temperature to convert a portion of said metal alloy layer into a Ni alloy monosilicide layer; and removing remaining metal alloy layer not converted into Ni alloy monosilicide. The alloying additives are selected for phase stability and to retard agglomeration. The alloying additives most efficient in retarding agglomeration are most efficient in producing silicides with low sheet resistance.

17 Claims, 6 Drawing Sheets

RETARDING AGGLOMERATION OF NI MONOSILICIDE USING NI ALLOYS

RELATED APPLICATION

This application is a divisional of U.S. application Ser. No. 10/334,464, filed Dec. 31, 2002 now U.S. Pat. No. 6,905,560.

FIELD OF THE INVENTION

The present invention relates to metal contacts for use in semiconductor devices, and more particularly to a method of fabricating a low resistance non-agglomerated Ni monosilicide contact. Reduced contact resistance provides semiconductor devices with the capability to operate at high speeds.

BACKGROUND OF THE INVENTION

In order to be able to fabricate integrated circuits (ICs) of increased performance than is currently feasible, device contacts must be developed which reduce the electrical contact resistance to the ICs' Si body or integrated electronic device formed therein. A contact is the electrical connection, at the Si surface, between the devices in the Si wafer and the metal layers, which serve as interconnects. Interconnects serve as the metal wiring that carry electrical signals throughout the chip.

Silicide contacts are of specific importance to IC's, including complementary metal oxide semiconductor (CMOS) devices because of the need to reduce the electrical resistance of the many Si contacts, at the source/drain and gate regions, in order to increase chip performance. Silicides are metal compounds that are thermally stable and provide for low electrical resistivity at the Si/metal interface. Silicides generally have lower barrier heights thereby improving the contact resistance. Reducing contact resistance improves device speed therefore increasing device performance.

Silicide formation typically requires depositing a refractory metal such as Ni, Co or Ti onto the surface of a Si-containing material or wafer. Conventional processing of Ni silicide films begins with depositing a Ni layer with a thickness of about 8 to 12 nm.

The thickness of the resulting silicide is twice the thickness of the deposited Ni layer, i.e. Ni layers with a thickness of about 8 to 12 nm form silicides with a thickness of about 16 to 24 nm, respectively. Following deposition, the structure is then subjected to an annealing step using conventional processes such as, but not limited to, rapid thermal annealing. During thermal annealing, the deposited metal reacts with Si forming a metal silicide. Following anneal a 10 nm Ni metal layer forms a Ni silicide that has a thickness of approximately 20 nm.

Ni may serve as a metal for silicide formation. One advantage of Ni silicides is that Ni monosilicide contacts consume less Si than conventional Ti or Co silicide contacts. A disadvantage of Ni silicide contacts is that the higher resistivity Ni disilicide phase is produced during high temperature processing steps, rather than the preferred lower resistivity Ni monosilicide phase. The formation of the Ni disilicide phase is nucleation controlled and disadvantageously consumes more Si than the preferred Ni monosilicide phase. Ni disilicides produce a rougher silicide/Si wafer interface and also have a higher sheet resistivity than the preferred Ni mono-silicide phase. A second disadvantage is that thin Ni monosilicide films tend to become discontinuous before Ni disilicide formation leading to high resistivity.

The highest processing temperatures of Ni silicide correspond to the boron phosphorus silicate glass densification anneal. Processing conventional Ni silicide films, of approximately 20 nm thickness, at temperatures greater than about 600° C. results in Ni silicides with a high sheet resistance. As depicted in FIG. 1, a 6 minute isothermal anneal of a conventional 24 nm Ni silicide film formed on standard poly-Si substrates at a temperature of about 660° C. increases the sheet resistance of the resultant Ni silicide by a factor of five. For 24 nm Ni silicide films formed on annealed poly-Si substrates, a 6-minute anneal at about 660° C. results in an increase of approximately 65% in the sheet resistance of the silicide film.

In view of the above, it would be highly desirable to provide a Ni monosilicide contact having low resistivity, and high temperature stability, while being easily fabricated utilizing well-known CMOS processing steps.

SUMMARY OF THE INVENTION

The present invention provides a method for producing thin Ni monosilicide films (having a thickness on the order of about 30 nm or less), as contacts in CMOS devices. The method of the present invention forms Ni monosilicide films without experiencing any of the problems associated with the prior art. The method of the present invention includes a step of introducing alloying agents into the Ni refractory metal layer to at least retard agglomeration. In some embodiments, an alloying additive that also increases the temperature at which the Ni monosilicide phase can exist without forming the Ni disilicide phase is employed.

In one aspect of the present invention, a method is provided wherein alloying additives which substantially retard agglomeration are employed. The alloying additives that substantially retard agglomeration are referred to herein as "anti-agglomeration" additives. Specifically, in this embodiment, the method of the present invention comprises the steps of:

(a) forming a Ni alloy layer over a portion of a Si-containing material, wherein said Ni alloy layer comprises one or more alloying additives, where said one or more alloying additives comprise at least one anti-agglomeration additive;

(b) annealing said Ni alloy layer at a temperature which is effective in converting a portion of said Ni alloy layer into either a Ni alloy monosilicide layer or metal rich Ni silicide layer, said Ni alloy silicide layer having a higher etch resistance than said Ni alloy layer; and (c) removing remaining Ni alloy layer not converted in step (b).

When the first anneal forms a metal rich silicide, a second anneal is needed after step (c) to form the low resistivity Ni monosilicide. This second anneal may be combined with other anneals during conventional processing steps.

In the above method, the alloying additive comprises elements that are efficient in retarding agglomeration of the Ni monosilicide layer. These anti-agglomeration additives are introduced to the metal alloy layer and facilitate the formation of a low resistivity, substantially non-agglomerated Ni monosilicide layer during the subsequent annealing process steps.

A second aspect of the present invention is also related to a method of fabricating a substantially non-agglomerated Ni alloy monosilicide, which comprises the steps of:

(a) forming a Ni alloy layer over a portion of a Si-containing material, wherein said Ni alloy layer comprises alloying additives, where said alloying additives comprise at least one anti-agglomeration additive and at least one Ni monosilicide phase stabilizing alloying additive;

(b) annealing said Ni alloy layer at a temperature which is effective in converting a portion of said Ni alloy layer into either a Ni alloy monosilicide layer or a metal rich Ni silicide layer, said Ni alloy silicide layer having a higher etch resistance than said Ni alloy layer; and (c) removing remaining Ni alloy layer not converted in step (b).

When the first anneal forms a metal rich silicide, a second anneal is needed after step (c) to form the low resistivity Ni monosilicide. This second anneal may be combined with other anneals during conventional processing steps.

In the above method, multiple additives are utilized to form a Ni alloy layer that produces a non-agglomerated Ni monosilicide film. Specifically, alloying additives are utilized in this embodiment for retarding both agglomeration of the Ni monosilicide layer and Ni disilicide phase formation. The alloying additive selected for being most efficient in increasing the high temperature phase stability of the Ni mono-silicide layer, retards the formation of the Ni disilicide phase. The resulting low sheet resistance non-agglomerated Ni monosilicide contact withstands higher temperatures without agglomerating or forming the Ni disilicide phase.

Another aspect of the present invention relates to a CMOS device that comprises at least the substantially non-agglomerated Ni alloy monosilicide contacts of the methods of the present invention. Specifically, the inventive electrical contact comprises:

a Si-containing material; and a substantially non-agglomerated Ni alloy monosilicide contact located on a portion of said Si-containing material, where said substantially non-agglomerated Ni alloy monosilicide contact comprises one or more alloying additives, where said one or more alloying additives comprise at least one anti-agglomeration additive, wherein said substantially non-agglomerated Ni alloy monosilicide contact withstands high processing temperatures.

DETAILED DESCRIPTION OF THE INVENTION

Figure 1:
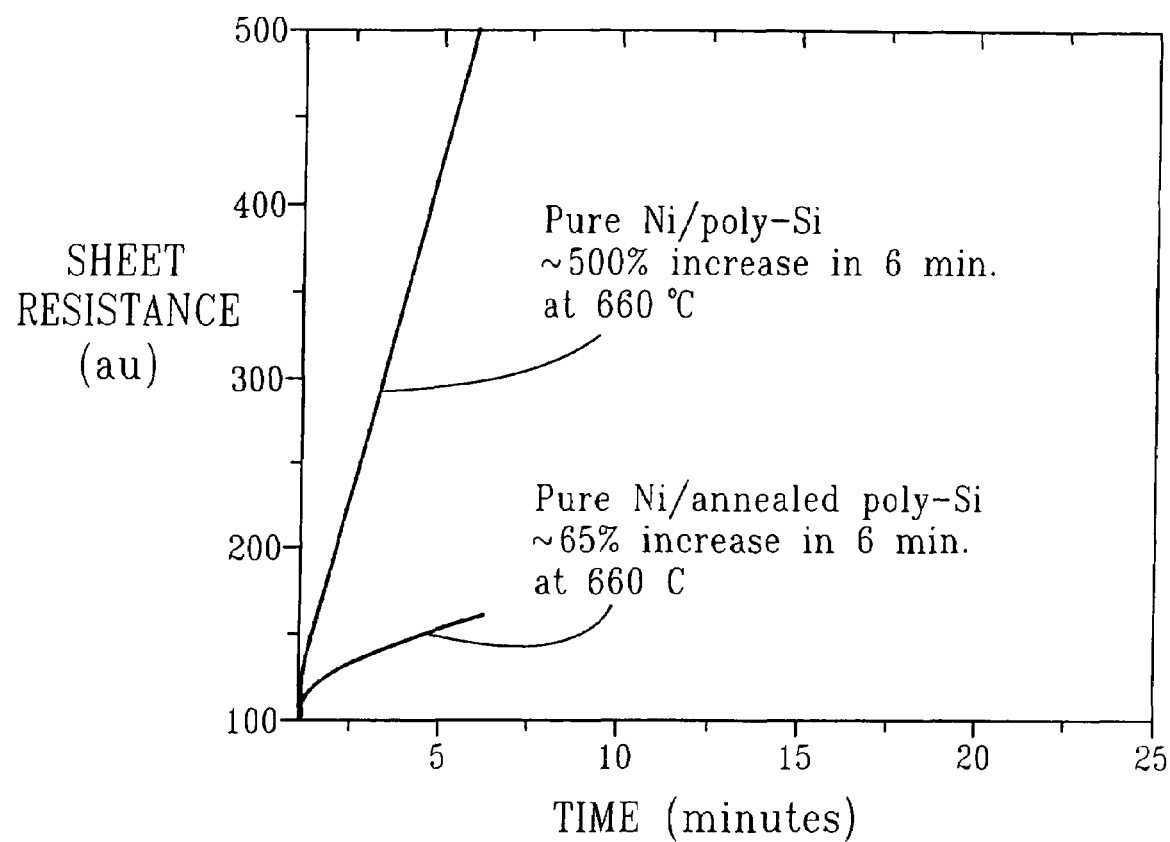
FIG. 1 is a representation of sheet resistance vs. time for monosilicide, at a temperature of about 660° C., on annealed and unannealed poly-Si substrates.

As stated above, the present invention provides methods of fabricating a low resistivity substantially non-agglomerated Ni alloy monosilicide, where the resistivity is about 15 to about 25 micro-ohm-cm. It was believed in the prior art that the main limitation of forming Ni monosilicide layers was the formation of high resistivity Ni disilicide at high temperature. It is now understood by the present applicants that the principal temperature limitation for silicidation of thin layers of Ni is agglomeration of the Ni monosilicide phase and not the formation of the high resistivity Ni disilicide phase as previously understood. Agglomeration starts with grain boundary grooving followed by eventual balling up of the film leading to a discontinuous and voided layer with substantially higher sheet resistance. It has been determined that during silicidation of thin layers of Ni, that agglomeration of the monosilicide layer occurs at temperatures much lower than the formation of the Ni disilicide phase. Using 10-15 nm thick conventional Ni metal layers the temperature at which the Ni disilicide occurs is about 700° C., while the temperature at which agglomeration occurs is about 550° C.

The present invention relates to methods where alloying additives are provided for:

i) Stabilizing the Ni monosilicide phase, ii) Retarding agglomeration, and iii) Stabilizing the Ni monosilicide phase and retarding agglomeration where the combination of alloying additives does not significantly increase the sheet resistance of the Ni silicide layer.

Alloying additives for retarding agglomeration of the Ni monosilicide phase, which are also referred to as anti-agglomeration additives in the present invention, comprise elements including, but not limited to: Ti, V, Cr, Zr, Nb, Mo, Hf, Ta, W, Re, or mixtures thereof. Specifically, alloying additives for retarding agglomeration preferably include Ta, W, Re or mixtures thereof. Alloying additives for stabilizing the mono-silicide phase, also referred to herein as Ni monosilicide phase stabilizing alloying additives, include but are not limited to: Ge, Rh, Pd, Pt or mixtures thereof.

The inventive methods begin with forming a Ni alloy layer over a portion of a Si-containing material. Conventional Si-containing materials include, but are not limited to: Si, single crystal Si, polycrystalline Si, SiGe, amorphous Si, silicon-on-insulator substrates (SOI), SiGe-on-insulator (SGOI), annealed poly Si, and poly Si line structures. The Si-containing material may be the substrate of the device, or a Si-containing layer formed atop the substrate, e.g., a polySi gate or a raised source/drain region.

The Ni alloy layer may be formed using conventional deposition techniques including, but not limited to: chemical vapor deposition (CVD), plasma-assisted CVD, high-density chemical vapor deposition (HDCVD), plating, sputtering, evaporation and chemical solution deposition. The deposition of the Ni alloy layer is continued until an initial thickness of about 30 nm or less, preferably about 15 nm or less, even more preferably about 10 nm or less, is produced.

The alloying additive may be present in the Ni alloy layer in an amount from about 0.01 atomic % to about 50 atomic %, preferably in an amount within the range of about 0.01 atomic % to about 20 atomic %, most preferably in an amount from 0.5 atomic % to 10 atomic %. The alloying additive may be formed initially within a Ni alloy layer during metal alloy deposition, by co-deposition or deposition from an alloy target. Alternatively, the alloying additive may be introduced to the Ni metal layer via ion implantation. Ion implantation techniques use either ion beam mixing of different ion types to produce a desired composition, or implantation of a desired species of alloying additives in a proportion needed to achieve proper stoichiometry. Further, the alloying additive may be introduced as a discrete layer on top of a Ni film through bilayer deposition.

As discussed above, the selection of alloying additives is dependent on the desired performance of the metal alloy layer. One embodiment of the present invention is to retard agglomeration of the Ni monosilicide layer at high temperatures on the order of about 650° C. or greater. In order to retard agglomeration, alloying elements are added to the Ni metal layer, where the alloying elements include, but are not limited to: Ti, V, Cr, Zr, Nb, Mo, Hf, Ta, W, Re, or mixtures thereof and most preferably Ta, W, and Re. These additives are anti-agglomeration additives.

Another aspect of the present invention includes the selection of alloying additives that are most efficient in stabilizing the Ni monosilicide phase in order to retard phase changes to Ni disilicide at high temperatures. Alloying additives efficient for stabilizing the Ni monosilicide phase include, but are not limited to: Ge, Rh, Pd, Pt or combinations thereof. These additives are Ni monosilicide phase stabilizing additives. A potential disadvantage of the Ni monosilicide phase stabilizing additives, such as Ge, Rh, Pd, and Pt, is that they increase the sheet resistitivity of the Ni silicide layer, decreasing the Ni silicide's performance as a contact.

A third embodiment of the present invention forms a ternary Ni alloy using both alloying additives, which are efficient in retarding agglomeration and are efficient for stabilizing the Ni monosilicide phase, to form a Ni silicide. Preferably, multiple alloying additives are selected, one from the group consisting of Ti, V, Cr, Zr, Nb, Mo, Hf, Ta, W, Re, and mixtures thereof, for preventing agglomeration; and another selected from the group consisting of Ge, Rh, Pd, Pt, and mixtures thereof, for phase stability. The ternary metal alloy layer employed in this embodiment of the present invention comprises Ni, a Ni monosilicide phase stabilizing additive, and an anti-agglomeration additive.

An advantage of utilizing the above Ni ternary alloy composition is that a more stable Ni silicide layer is formed in terms of phase stability and agglomeration. A further advantage using both types of additives to form a Ni ternary alloy is that while additives most efficient for stabilizing the Ni monosilicide phase increase the sheet resistance of the Ni silicide formed therefrom, elements that serve as alloying additives for retarding agglomeration increase the sheet resistance of the Ni silicide to a lesser degree. Therefore by mixing both additives both low sheet resistivity and Ni monosilicide phase stability can be achieved. Unexpectedly, combining the two categories of alloying additives in a ternary metal alloy layer produces a silicide with a sheet resistance that is significantly lower than if only alloying additives that are efficient for phase stabilization had been utilized.

Optionally, following Ni metal alloy layer formation, a barrier layer may be formed over the metal alloy layer. The optional barrier layer may comprise any material that protects the Ni metal alloy layer from oxidation. Examples of materials suitable for barrier layers include, but are not limited to: SiN, TaN, TiON, TiN and mixtures thereof. The optional barrier layer is removed during annealing of the metal alloy layer.

Following formation of the Ni alloy layer, an annealing process step is performed at a temperature that is effective in converting a portion of the metal alloy layer into a non-agglomerated Ni alloy monosilicide. Often the thermal anneal is conducted using Rapid Thermal Anneal (RTA) or other conventional annealing process. Consistent with conventional semiconductor device production a thermal dose of about 650° C. for approximately 30 minutes is appropriate. Other temperatures, which are appropriate for annealing, include from about 250° C. to 600° C., most preferably from about 400° C. to 550° C.

Optionally, a second anneal is performed to a temperature that is effective to further reduce the resistance of the silicide contact. Due to the high temperature performance of the above-described non-agglomerated Ni monosilicide contacts, the second anneal may be performed at temperatures of about 500° C. to 700° C., most preferably from 500° C. to 600° C.

Low temperature anneals form metal rich silicide phases, which resist selective etch process steps. Low temperature anneals are conducted at less than about 500° C., preferably lower than about 350° C. The metal rich phases could be: $Ni_3Si_2$, $Ni_2Si$, and possibly even $Ni_{31}Si_{12}$ and $Ni_3Si$, where the Ni content is higher than the Si content. When a metal rich phase is produced a second higher temperature anneal is required to form the low resistivity Ni monosilicide.

Following the formation of the non-agglomerated Ni monosilicide layer, the unreacted remaining portions of the Ni metal alloy layer are removed using a conventional etch process, such as wet etching, reactive-ion etching (RIE), ion beam etching, or plasma etching. The resultant non-agglomerated Ni monosilicide layer that remains is more resistive to etch processing steps when compared to the non-reacted metal layer that is removed during the etching step. The final thickness of the non-agglomerated Ni alloy monosilicide contact ranges from about 15 nm to about 35 nm. The above silicide formation is compatible with conventional semiconductor processing steps that are well-known within the art.

Figure 2:
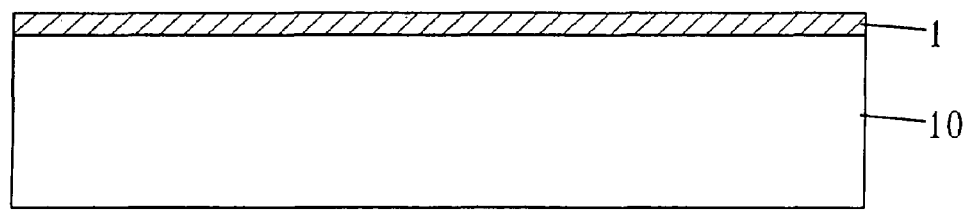
FIG. 2 is a cross sectional representation of the inventive substantially non-agglomerated Ni alloy monosilicide contact.
Figure 3A:
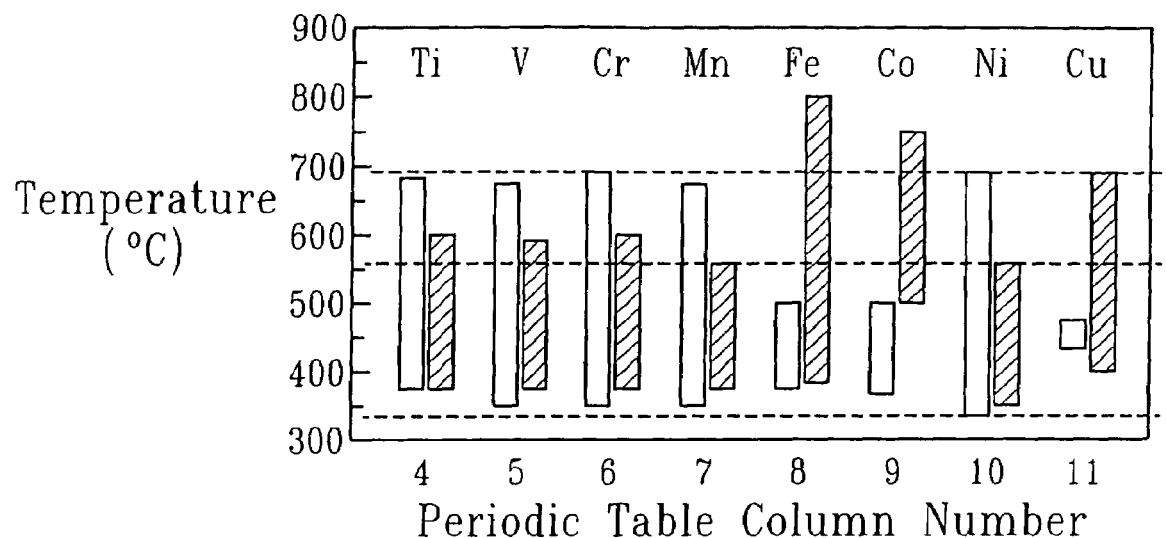
FIGS. 3(a)-(d) depicts temperature windows for Ni monosilicide stability and low resistivity for various alloying elements added to Ni.
Figure 3B:
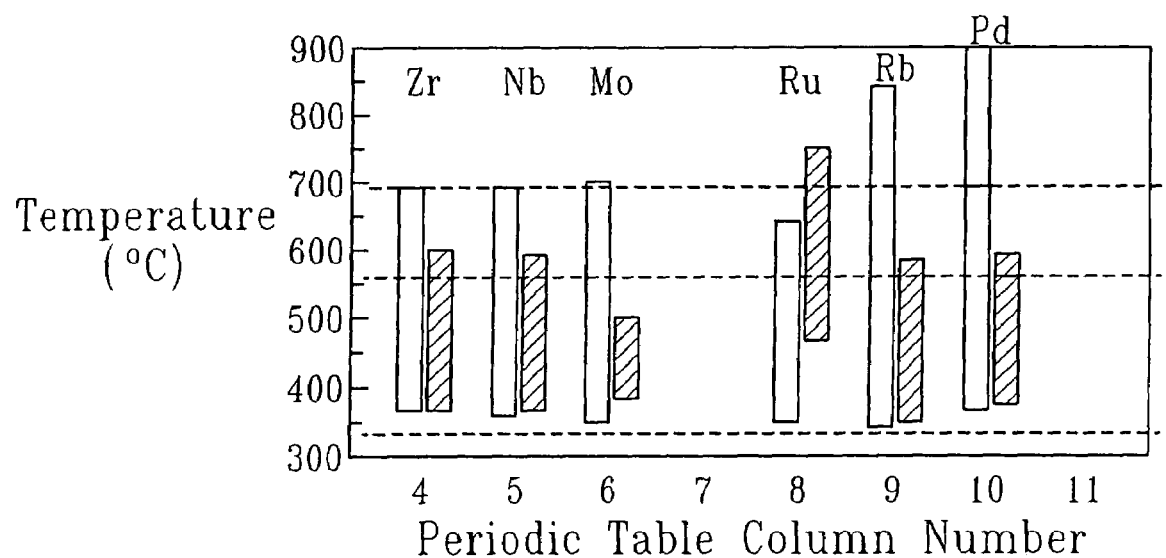
Figure 3C:
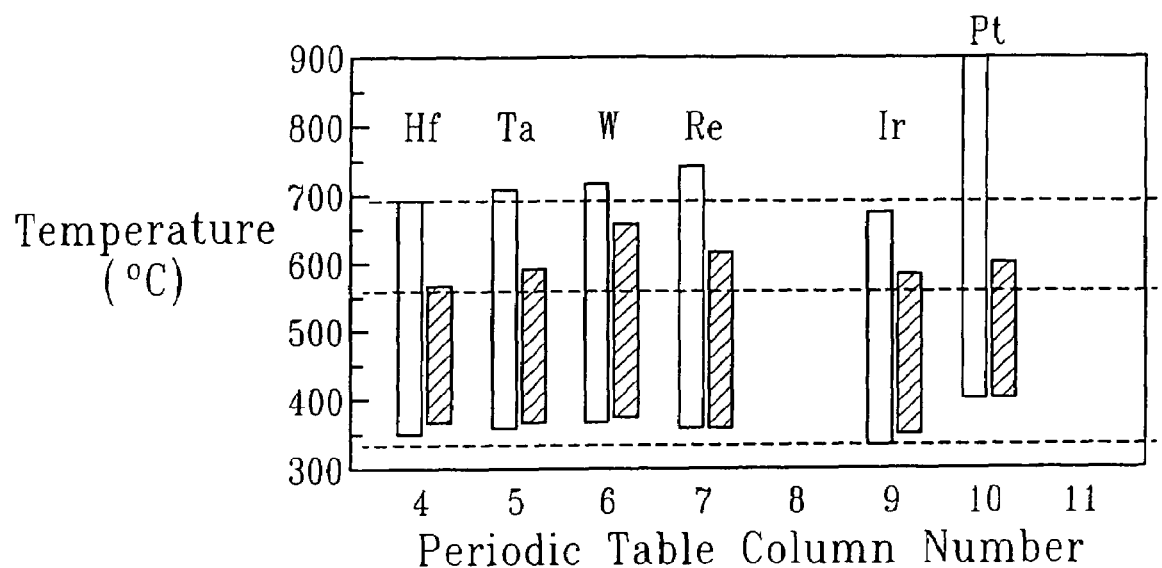
Figure 3D:
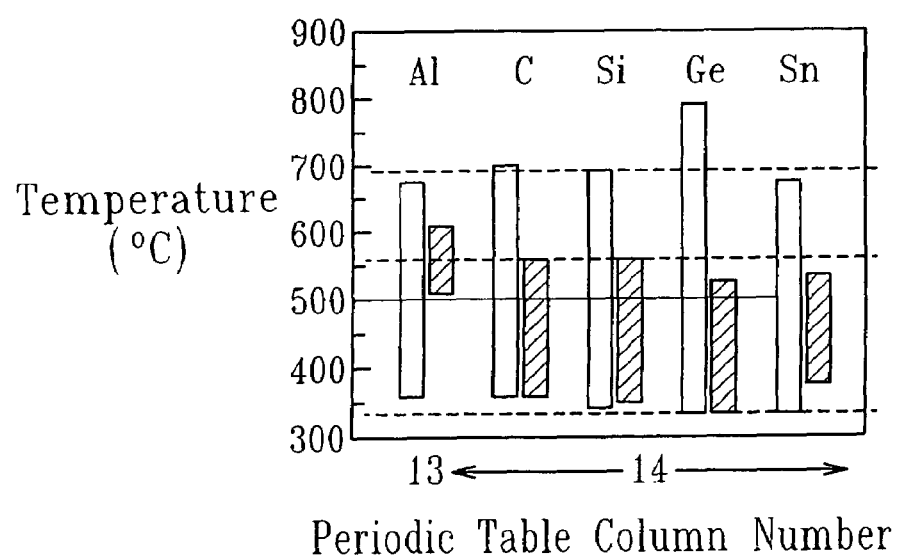

Another aspect of the present invention relates to a CMOS device produced using the above method. Referring to FIG. 2, the inventive CMOS device comprises of a low resistivity substantially non-agglomerated Ni monosilicide contact 1 formed atop a Si-containing material 10.

The non-agglomerated Ni alloy monosilicide contact 1 can be subjected to the high processing temperatures associated with conventional semiconductor production, without negatively affecting the performance of the contact. The composition of the inventive substantially non-agglomerated Ni alloy monosilicide contact includes at least one alloying additive in an amount from about 0.01% to about 50 atomic %. The alloying additive is selected as described in the above inventive methods.

The following examples are given to illustrate the present invention and to demonstrate some advantages that can arise therefrom. In the following examples, Ni monosilicide films are formed utilizing a 10 nm thick Ni metal alloy layer deposited onto conventional substrates.

During the annealing of the inventive Ni alloy layer, including alloying additives, phase stability and agglomeration was measured utilizing resistance and elastic light scattering measurements, as well as, utilizing in-situ X-ray diffraction. X-ray diffraction was utilized to determine the temperature range for formation of the Ni monosilicide phase. The results of these measurements are depicted in FIGS. 3(a)-(d), where the solid black bar represents the temperature window for the Ni mono-silicide phase of the alloying additives as indicated.

Resistance measurements indicate the temperature window for which agglomeration does not occur, resulting in the formation of low resistivity silicide. The results of the resistance measurements are depicted in FIGS. 3(a)-(d), where the gray shaded bar indicates the temperature window and the high and low limits of the window indicate a 20% rise in the minimum value resistance at that corresponding temperature. Measurements were recorded for a temperature ramp rate of about 3° C. per second, from about 100° C. to 950° C.

EXAMPLE 1

Formation of a Ni Alloy Layer where Alloying Additives Efficiently Stabilize a Ni Mono-silicide Phase at High Temperature In this example, alloying additives that efficiently stabilize the Ni monosilicide phase at high temperatures were incorporated into a metal alloy layer, which was deposited onto a As doped poly-Si substrate.

A Ni metal alloy was formed where the alloying additive was present in an amount of about 10 atomic %. The alloying additive most efficient for stabilizing the monosilicide phase was selected from Rh, Pd, Ge, and Pt. The alloying additive most preferred for stabilizing the Ni monosilicide phase is Pt.

Referring to FIGS. 3(a)-(d), comparing the silicide formed from a conventional Ni metal alloy layer to the temperature window for phase stability and low resistivity of the alloyed metal layer, it was apparent that the alloying additives Ge, Rh, Pd, and Pt are very effective at retarding the formation of the Ni disilicide phase. The maximum temperature at which the Ni monosilicide phase is stable utilizing 10 nm Ni metal layers is about 700° C. and the temperature range of the lower resistivity silicide is from about 320° C. to about 560° C. In comparison to conventional Ni metal layers, when utilizing Ni metal alloy layers incorporating 10 atomic % Pt for Ni silicide formation the maximum temperature at which the monosilicide phase is stable is increased to greater than about 900° C. and the low resistivity temperature window is increased to range from about 400° C. to about 600° C.

EXAMPLE 2

Formation of a Ni Alloy Layer where Alloying Additives Efficiently Retard Agglomeration During Silicidation In this example, alloying additives that efficiently stabilize the Ni monosilicide phase at high temperature are incorporated into a 10 nm Ni metal alloy layer, which was deposited onto an As doped poly-Si substrate.

A Ni metal alloy comprising 10 atomic % alloying additive was formed, where the alloying additive most efficient for retarding agglomeration was selected from Ti, V, Cr, Zr, Nb, Mo, Hf, Ta, W, and Re. The alloying additives most preferred for retarding agglomeration are Zr, Ta, W and Re.

Referring to FIGS. 3(a)-(d), the temperature windows for phase stability and low resistivity indicate that the additives Ti, V, Cr, Zr, Nb, Mo, Hf, Ta, W, or Re are very effective at retarding agglomeration of the Ni monosilicide phase and therefore increase the temperature window for formation of low resistivity of Ni silicides, when compared to conventional Ni metal layers. The maximum temperature at which the Ni monosilicide phase is stable utilizing conventional Ni metal layers is about 700° C. and the temperature range for lower resistivity is from about 320° C. to about 560° C.

Still referring to FIGS. 3(a)-(d), alloying the Ni metal layer with the preferred additives, Zr, Ta, W and Re, increases both the temperature window for low resistivity and has no effect or slightly increases the stability of the monosilicide phase, when compared to silicidation of conventional Ni metal layers. Alloying the Ni metal layer with Zr or Ta does not greatly affect the stability of the monosilicide phase, yet the high value of the temperature window for production of lower resistivity silicide layers is increased to about 600° C. When the alloying additive is W the stability of the monosilicide phase is slightly increased to greater than approximately 700° C. and the temperature window for low resistivity silicide formation is increased to range from about 350° C. to about 650° C. Finally, when the alloying additive is Re the temperature window for phase stability ranges from about 350° C. to about 750° C. and the temperature window for low resistivity silicide formation increases to a range of about 350° C. to about 600° C.

EXAMPLE 3

Formation of a Ni Alloy Layer where Alloying Additives Efficiently Retard Agglomeration and Stabilize the Monosilicide Phase during Silicidation In this example alloying additives, which efficiently retard agglomeration and stabilize the Ni monosilicide phase, are incorporated into a metal ternary alloy layer in order to facilitate the formation of a low resistivity Ni monosilicide layer. The metal ternary alloy layers were deposited on blanket film substrates including n-doped, p-doped, undoped poly-Si and narrow parallel lines of poly-Si of about 90 nm in width and about 8 mm in length.

A Ni ternary metal alloy comprising 10 atomic % alloying additive is formed, where the alloying additives are selected for efficiency in retarding agglomeration and stabilization of the Ni monosilicide phase during silicidation. The alloying additives most efficient for retarding agglomeration are selected from the group consisting of Ti, V, Cr, Zr, Nb, Mo, Hf, Ta, W, and Re. The alloying additives most efficient for stabilizing the mono-silicide phase are selected from Rh, Pd, Ge, and Pt. The most preferred metal alloy composition includes a Ni metal layer with about 5 atomic % Re and about 5 atomic % Pt.

Figure 4:
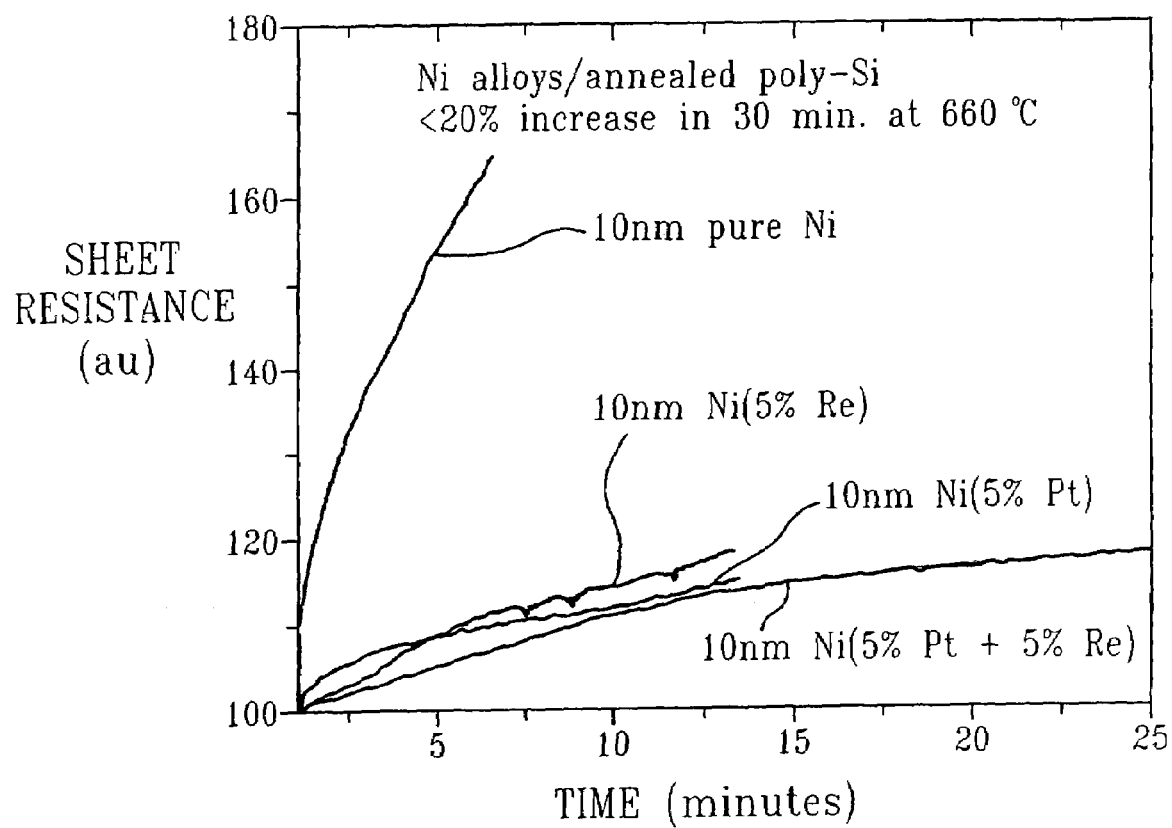
FIG. 4 is a representation of sheet resistance vs. time for Ni alloy monosilicides compared to Ni monosilicide, at a temperature of about 660° C., on annealed and unannealed poly-Si substrates.

FIG. 4 depicts the sheet resistance of a Ni metal layer, with about 5 atomic % Re and about 5 atomic % Pt, where the resistance is measured as a function of time during a thermal anneal at about 660° C. While the pure Ni film annealed at a temperature of approximately 660° C. for about six minutes increased in sheet resistance by about 60%; a Ni metal alloy containing about 5 atomic % of both Re and Pt showed an increase in sheet resistivity of less than approximately 20% after about 20 minutes at about 660° C. The resistivity measurements where taken from uncapped silicide layers and had the silicide been capped, as in conventional processing, the resistivity measurements would be even less.

Figure 5:
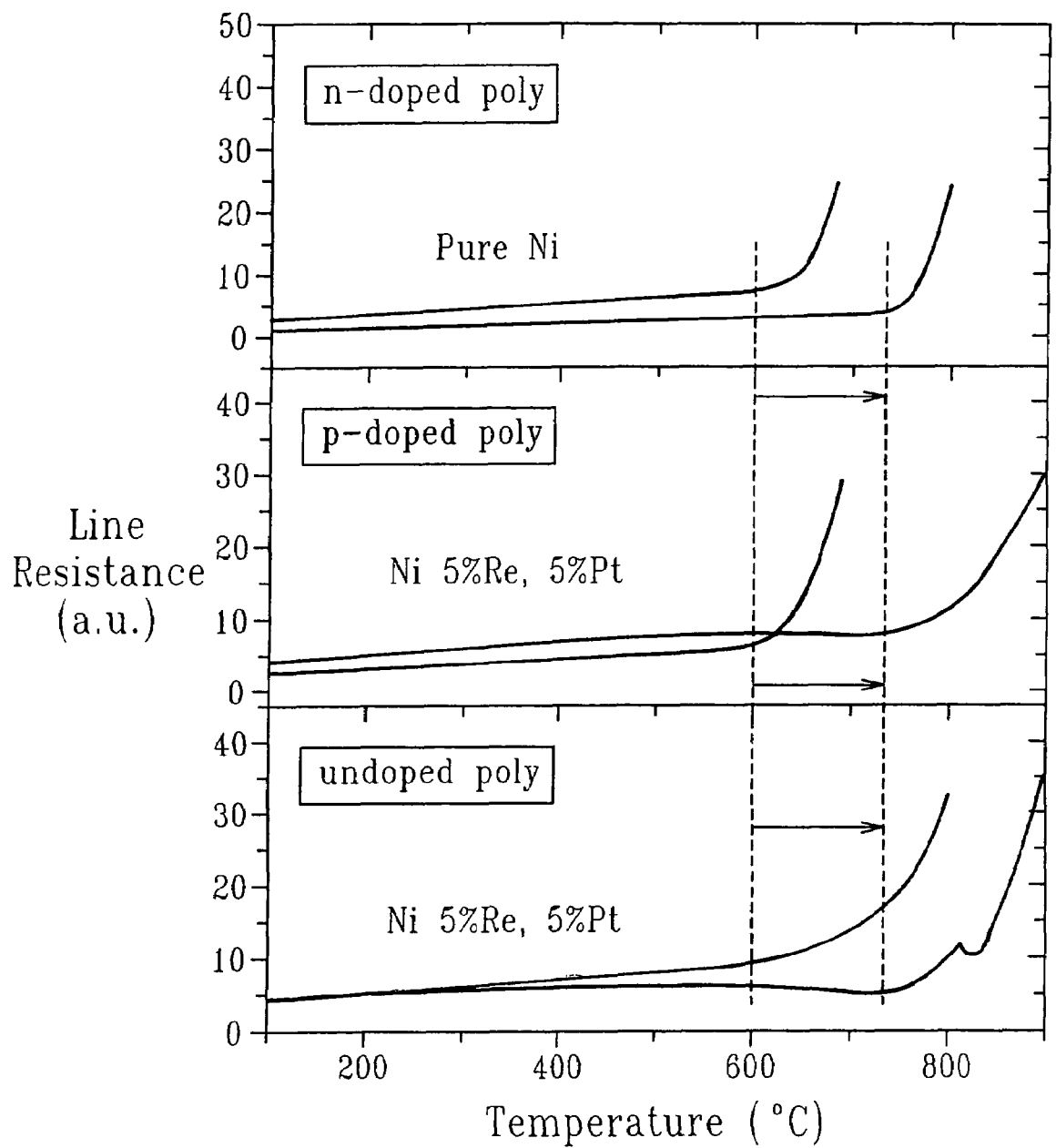
FIG. 5 is a representation of line resistance vs. temperature for a ternary Ni alloy metal layer deposited on narrow parallel lines of poly-Si (with various dopants).

FIG. 5 depicts a comparison of pure Ni metal layer and a ternary Ni metal alloy layer (about 5 atomic % Pt and about 5 atomic % Re) on p-doped, n-doped, and undoped substrates of narrow parallel lines of poly-Si with dimensions of about 90 nm in width and about 8 mm in length. As depicted in FIG. 5, the ternary Ni metal alloy layer can withstand higher temperatures than a conventional Ni metal layer without forming a high resistivity Ni silicide layer.

As discussed above it is clear that the limiting factor for device processing is not the formation of the Ni disilicide phase but the agglomeration of the Ni monosilicide phase. It has been demonstrated that the onset of agglomeration occurs at a lower temperature than the phase change to Ni disilicide for film thickness less than about 15 nm.

Figure 6:
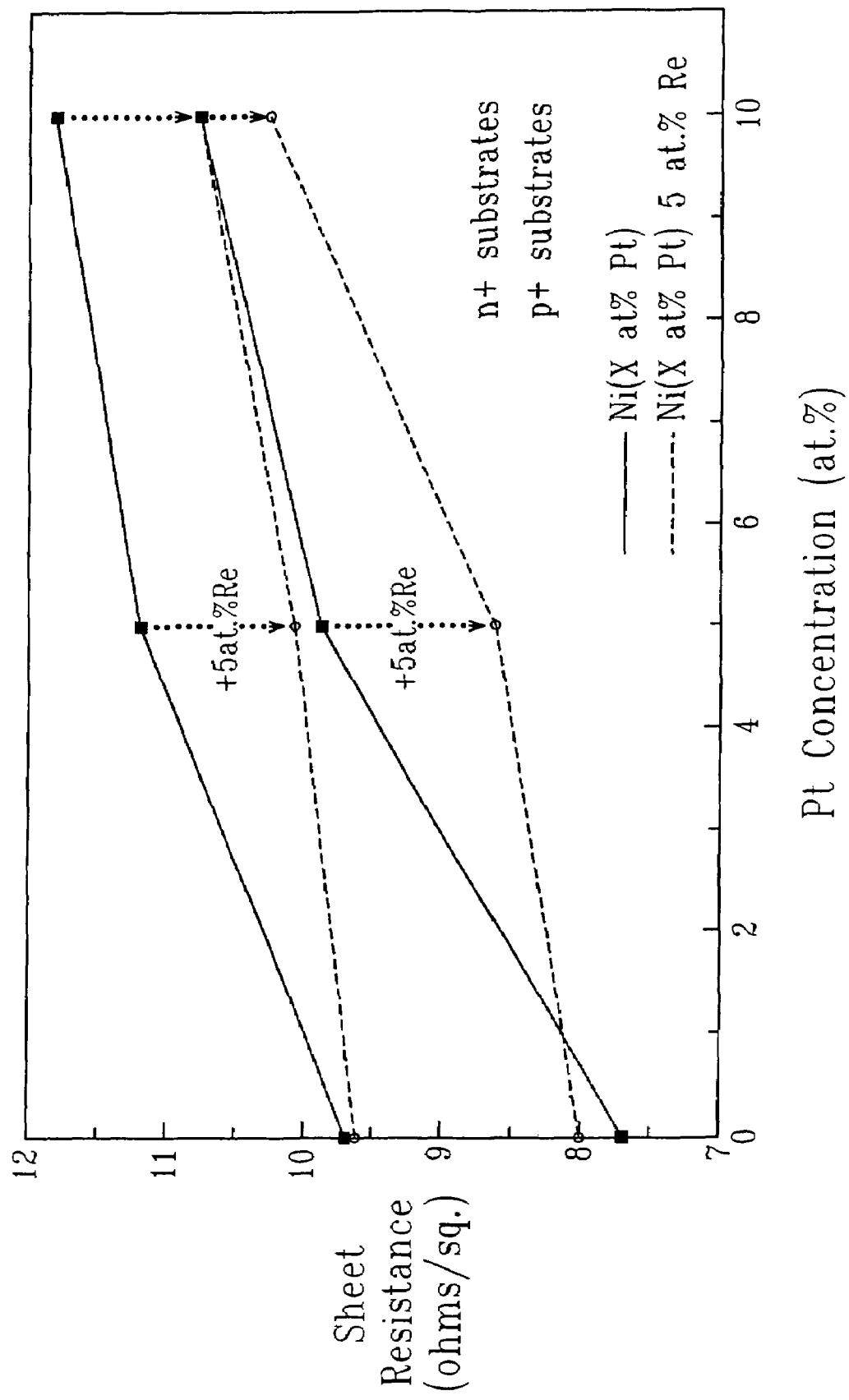
FIG. 6 is a representation of sheet resistance vs. Pt concentration depicting a ternary Ni metal alloy having a lower resistance than a Ni—Pt metal alloy layer.

Another advantage of the inventive Ni ternary metal alloy is that it allows for phase stability as well as low resistance. Although additives that increase phase stability also help to retard agglomeration, when compared to conventional Ni metal layers, it is clear that as the level of the phase stabilization additive is increased so is the resistivity of the resultant silicide. By including both alloying additives for phase stabilization and for retarding agglomeration, the stability of the monosilicide phase is increased while the resistivity of the films is reduced. Referring to FIG. 6, an example of the above described properties are depicted in a ternary Ni metal alloy, comprising about 5 atomic % Pt and about 5 atomic % Re, where the ternary alloy retards agglomeration, increases phase stability of the Ni monosilicide phase and decreases the sheet resistance as compared to the Ni alloy which only incorporates a phase stabilizing additive such as Pt.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim is new, and desire to secure by Letters Patent is:

1. An electrical contact comprising:
   a Si-containing material; and
   a substantially non-agglomerated contact located on a portion of said Si-containing material, where said substantially non-agglomerated contact includes Ni monosilicide containing one or more alloying additives, wherein said one or more alloying additives comprise at least one anti-agglomeration additive that comprises V, Cr, Zr, Nb, Mo, Hf, Ta, W, Re or mixtures thereof.

2. The electrical contact of claim 1 wherein said Si-containing material comprises single crystal Si, polycrystalline Si, annealed polycrystalline Si, SiGe, amorphous Si, silicon-on-insulator (SOI) or SiGe-on-insulator (SGOI).

3. The electrical contact of claim 1 wherein said at least one anti-agglomeration additive is Ta, W, Re or mixtures thereof.

4. The electrical contact of claim 1 wherein said at least one anti-agglomeration additive is present in an amount of from about 0.01 at. % to about 50 at. %.

5. The electrical contact of claim 1 wherein said at least one anti-agglomeration additive is present in an amount of from about 0.01 atomic % to about 20 atomic %.

6. The electrical contact of claim 1 wherein said one or more alloying additives is present in an amount of from about 0.01 at. % to about 50 at. %.

7. The electrical contact of claim 1 wherein said one or more alloying additives is present in an amount of from about 0.01 atomic % to about 20 atomic %.

8. The electrical contact of claim 1 wherein said substantially non-agglomerated contact further comprises at least one Ni monosilicide phase stabilizing alloying additive.

9. The electrical contact of claim 8 wherein said at least one Ni monosilicide phase stabilizing alloying additive comprises Ge, Rh, Pd, Pt or mixtures thereof.

10. The electrical contact of claim 8 wherein said one or more alloying additives are present in an amount of from about 0.01 at. % to about 50 at. %.

11. The electrical contact of claim 8 wherein said one or more alloying additives are present in an amount of from about 0.01 atomic % to about 20 atomic %.

12. The electrical contact of claim 8 wherein said substantially non-agglomerated Ni alloy monosilicide contact has a thickness of less than 100 nm.

13. An electrical contact comprising:
   a Si-containing material: and
   a substantially non-agglomerated contact having a thickness of less than 30 nm located on a portion of said Si-containing material, where said substantially non-agglomerated contact includes Ni monosilicide containing one or more alloying additives, wherein said one or more alloying additives comprise at least one anti-agglomeration additive.

14. An electrical contact comprising:
   a Si-containing material; and
   a substantially non-agglomerated contact located on a portion of said Si-containing material, where said substantially non-agglomerated contact includes Ni monosilicide containing one or more alloying additives, wherein said one or more alloying additives comprise at least one anti-agglomeration additive and at least one Ni monosilicide phase stabilizing alloying additive, wherein said at least one anti-agglomeration additive comprises V, Cr, Zr, Nb, Mo, Hf, Ta, W, Re or mixtures thereof.

15. The electrical contact of claim 14 wherein said at least one anti-agglomeration additive is Ta, W, Re or mixtures thereof.

16. The electrical contact of claim 14 wherein said at least one Ni monosilicide phase stabilizing alloying additive comprises Ge, Rh, Pd, Pt or mixtures thereof.

17. An electrical contact comprising:
   a Si-containing material; and
   a substantially non-agglomerated contact located on a portion of said Si-containing material, where said substantially non-agglomerated contact includes Ni monosilicide containing one or more alloying additives, wherein said one or more alloying additives comprise at least one anti-agglomeration additive and at least one Ni monosilicide phase stabilizing alloying additive, said Ni monosilicide phase stabilizing alloying additive comprising Ge, Rh or a mixture thereof.

* * * * *